United States Patent [19]

Feldstein

[11] 4,323,594

[45] Apr. 6, 1982

[54] COLLOIDAL DISPERSIONS FOR ACTIVATING NON-CONDUCTORS PRIOR TO ELECTROLESS PLATING

[76] Inventor: Nathan Feldstein, 63 Hemlock Cir., Princeton, NJ 08540

[21] Appl. No.: 153,272

[22] Filed: May 27, 1980

Related U.S. Application Data

[60] Continuation-in-part of Ser. No. 672,044, Mar. 30, 1970, which is a division of Ser. No. 607,506, Aug. 26, 1975, Pat. No. 3,993,799, which is a continuation-in-part of Ser. No. 512,224, Oct. 4, 1974, abandoned.

[51] Int. Cl.$^3$ .................................................. C23C 3/02
[52] U.S. Cl. ..................................... 427/98; 106/1.11; 252/313R; 427/305; 427/306
[58] Field of Search .......................... 106/1.05, 1.11; 252/313 R; 427/304, 98, 305

[56] References Cited

U.S. PATENT DOCUMENTS

| | | | |
|---|---|---|---|
| 2,072,809 | 3/1937 | Bley | 106/15 AF |
| 3,082,103 | 3/1963 | Wainer | 106/55 |
| 3,657,003 | 4/1972 | Kenney | 252/313 R |
| 3,958,048 | 5/1976 | Donovan et al. | 427/304 |
| 4,087,586 | 5/1978 | Feldstein | 428/457 |
| 4,132,832 | 1/1979 | Feldstein | 106/1.11 |
| 4,151,311 | 4/1979 | Feldstein | 427/53 |

*Primary Examiner*—Lorenzo B. Hayes

[57] ABSTRACT

Metallic surfaces are imparted to non-conductive or dielectric substrates by an electroless (chemical) coating process comprised of coating the surface of the substrate with colloids having a nucleus of catalytic non-precious metals wherein the metals are either part of an alloy or in the elemental state or a compound and wherein the colloidal compositions further contain copper (I) which renders the colloids a greater catalytic activity when used in the plating process as well as when used in photochemical activity.

5 Claims, No Drawings

COLLOIDAL DISPERSIONS FOR ACTIVATING NON-CONDUCTORS PRIOR TO ELECTROLESS PLATING

Reference to Prior Applications

This application is a continuation-in-part of U.S. application Ser. No. 672,044, filed on Mar. 30, 1970 which is a divisional application of U.S. application Ser. No. 607,506, filed on Aug. 26, 1975 now U.S. Pat. No. 3,993,799 which is a continuation-in-part of U.S. application Ser. No. 512,224 filed Oct. 4, 1974, now abandoned.

BACKGROUND OF THE INVENTION

Electroless or autocatalytic coating of dielectric surfaces is a well known process finding widespread utility in the preparation of such diverse articles as printed circuits, automotive trim, mirrors, etc.

Normal commercial electroless coating processes generally involve an initial cleaning and etching of the dielectric substrate by physical or chemical means to improve adherence of the metallic coating. Etching also renders the substrate a greater hydrophilic nature. The etched surface is then catalyzed by suitable catalytic compositions and processes to provide a surface capable of electroless plating initiation. In the prior art, the catalytic treatment generally encompasses the use of precious metals. More recently, compositions and processes utilizing non-precious metals have been disclosed suitable for electroless plating of dielectrics. U.S. Pat. Nos. 3,958,048; 3,993,491; 3,993,799; 4,167,596; 4,136,216; 4,180,600; 4,151,311; 4,150,171; 4,048,354; 4,181,759; 4,087,586; 4,082,899; 4,131,699; 3,993,801; 3,993,848 and 4,132,832 show that colloidal systems based upon non-precious metals could constitute the basis for new commercial plating processes. These patents are included herein by reference. Also of interest are the following patents and article, noted in the way of prior art: Japanese Patent 49/126,999, U.S. 3,949,121, British Patent 1,426,462, and Weiser "Inorganic Colloid Chemistry", Vol. I, pp. 1-5 and pp. 137-143, John Wiley & Sons, Inc. (1933) which disclose the prior art as well as the recent advancements in which non-precious metals have been reported.

In reviewing some of the teachings disclosed, it is evident that colloids of either hydrous oxides, metals (elemental state) and alloys (phosphides, borides, nitrides, copper/tin, etc.) are useful in the catalytic treatment either as a two step or a single step activation treatment. Generally speaking, preferred metals in the above colloids are selected from the group consisting of cobalt, copper, iron and nickel although, as suggested in U.S. Pat. No. 3,993,799, other non-precious metals may be used. It is recognized that it is generally desirable to have suspensions (dispersions) of very fine particulate matter for both stability (i.e., against precipitation), reactivity, and adhesion to the substrate. Accordingly, it is highly desirable to prepare such suspensions under conditions which would yield finely divided and highly stable colloids with good adsorption.

It is also well recognized in the art of electroless plating that for effective electroless plating onto catalytically treated non-conductors, at least one of the following requirements must be met:

Case I: The catalytic surface may react chemically with the reducing agents present within the electroless plating bath. More than one chemical reaction may take place.

Case II: The catalytic surface may react chemically with the metallic ions present within the electroless plating bath in a galvanic type replacement reaction.

In Case I, the chemical reactions may range from chemical reduction of the catalytic components present on the dielectric, and/or decomposition of the reducing agent at the interface ultimately yielding hydrogen gas via an active reducing agent intermediate. In Case II, to permit a galvanic replacement reaction, it is recognized that some of the metal ions present in the solution must be more noble with respect to the metal and metal ions present on the treated non-conductor surface. Such relationship is well recognized from the EMF series. Thus, while metals like copper, cobalt, nickel and iron may be preferred as recognized in U.S. Pat. No. 3,993,799, yet other non-precious metals may also be of potential use (e.g., zinc, manganese, etc.). It is further recognized that it is highly desirable to have catalysts which when contacted with the chemical (electroless) plating bath will yield short induction times which generally takes place prior to the actual metal deposition. Generally speaking, it is recognized that whenever the induction time is short, the probability for complete metallic coverage is better and thus eliminates the problem of skip plating.

SUMMARY OF THE INVENTION

It is the principal object of the present invention to provide an effective and economical process and compositions for preparing dielectric substrates for electroless coating or plating of a metallic surface thereon, and to provide an electroless coating process including such preparation.

It is a particular object of the present invention to provide improved compositions through which the catalytic activity would be increased. Other objectives of the present invention, if not specifically set forth herein, will be apparent to the skilled artisan upon the reading of the Detailed Description of the Invention which follows.

Surprisingly, it has been discovered that the aforesaid objectives may be achieved by a process and composition which render the colloidal composition a greater adsorption and hence provide a greater catalytic activity for the colloid when adsorbed onto the non-conductors. The improved compositions incorporate the addition of cuprous ion(s) subsequent to the nucleation of the colloidal dispersion comprising copper.

DETAILED DESCRIPTION OF THE INVENTION

The process of the present invention is applicable to metallic plating of a wide variety of dielectric (non-conductor) substrates. Dielectric substrates described in the prior art, including thermoplastic and thermosetting resins and glass, may also be suitably plated in accordance with the present invention. Normally, these substrates will be cleaned and surface treated prior to plating in order to improve adherence of the metallic coating. The present invention is an improvement to the processes and compositions disclosed in the above cited references.

The colloids of the present invention are generally prepared by adding the selected compound of a catalytic metal or a salt thereof, e.g., the sulfate, nitrate, chloride, bromide or acetate salts, preferably in an aqueous medium to produce an aqueous solution and reacting the above solution with a chemical agent which will yield by precipitation (nucleation) either a reduced metal, compound or an alloy of said metal. The precipitation reaction is generally carried forth in the presence of at least one colloid stabilizer thereby stabilizing the resulting colloid formed and insuring good dispersion for the medium. Alternately, a powder may be formed and precipitated and thereafter be redispersed.

Although there are various methods for the preparation of colloids, e.g., U.S. Pat. No. 2,438,230, such approaches, while simple to implement, do not provide as great a freedom with respect to selectivity of colloids formed and their properties as those produced by the precipitation technique. U.S. Pat. No. 3,635,668 describes a process for the production of copper hydrate suitable for use as a fungicide. U.S. Pat. No. 3,082,103 demonstrates a universal milling technique by which finely divided oxides may be formed. It should also be noted that while most of the examples in the present invention are directed to formation of the colloidal dispersions via precipitation techniques, the present invention is not limited to this approach. Specifically, catalytic colloidal compositions may also be prepared by the resuspension and stabilization of properly prepared powders. Hence, the manner by which the chemical components are used in preparing said colloidal catalytic compositions is a matter of convenience, e.g., shipping costs. The precipitation technique for producing the catalytic medium is believed however to possess certain advantages. Specifically, this technique is potentially capable of producing colloids of varied size, shape, and chemical make-up. This freedom is especially useful with respect to desired subsequent catalytic properties. Furthermore, such technique is also useful in the preparation of reduced metal or metal-alloys or compounds by adding a suitable precipitating agent (e.g., reducing agent), which can form the reduced metallic state or the alloys or the resulting compound(s) through its chemical interaction with the metal ion(s). Typical reducing agents are tannic acid, hydrazine, amineboranes, hypophosphites, borohydrides, sulfur types, etc. In the event that the colloids are prepared by a precipitation technique it may further be recommended that after preparation, centrifugation, washing and redispersion in pure water be undertaken thereby removing extraneous ionic species and insuring a medium with low ionic strength.

The stability of the above colloidal compositions may be enhanced by various techniques, e.g., dialysis, repetitive centrifugation and washings, as well as by the addition of various materials, referred to herein as stabilizers. The term "stabilizer" is used herein to generally describe chemicals believed to be adsorbed onto the colloids or the colloid is adsorbed onto the stabilizer thereby altering the charge characteristics of said colloids and thus preventing their coagulation. Stabilizers may be of organic or inorganic nature.

Stabilizers contemplated by the present invention include secondary colloids, polyalcohols, sugars, dispersants and surfactants, which while by themselves do not serve to catalyze the dielectric substrate in this process, they are believed to stabilize the active colloid by an encapsulation (or adsorption) mechanism. It is noted that for a specific composition more than one stabilizer may be present. Stabilizers may also be chemicals which take part within the colloidal double layer structure.

Typical secondary colloids are gum arabic, gelatin, agar agar, starch, albumin, hemoglobin, cellulose derivatives such as carboxymethyl cellulose and hydroxypropyl cellulose, N-alkylbeta-aminopropionic acid, carboxymethyl dextran, and the like. Typical sugars include mannitol, sorbitol, dulcitol maltose, and arbinose raffinose.

Surfactants may also be suitably employed as a stabilizer for the colloids. The surfactant, or surface active agent, as used herein, generally refers to substances which are capable of lowering the surface tension of a liquid or the interfacial tension between two liquids. All such substances possess the common feature of a water-soluble (hydrophilic) group attached to an organic (hydrophobic) chain. Surfactants as used herein are also intended to encompass detergents, dispersants and emulsifying agents regardless of whether they are or are not capable of lowering the interfacial surface tension. The surfactants used are not limited to the hydrocarbon type and they can be fluorocarbon or silicon bearing type.

It is also contemplated that a mixture of surfactants or surfactants with other stabilizers may be used. Care should be exercised (e.g., excess concentration) in the use of surfactants in the preparation of the present colloids, as would be noted by anyone skilled in the art.

The term "precipitation agent" as used herein is generally intended to encompass those chemical compounds which when contacted with metallic ions (with or without added energy) cause the onset (nucleation) of the secondary phase (insoluble phase). Typical materials may be reducing agents, hydroxides, sulphides, and others. At times, depending on the chemical nature of the precipitation agents, codeposits within the resulting colloids are noted.

In general, the electroless coating process of the present invention comprises contacting (e.g., by immersion) the dielectric substrate, preferably previously etched with the colloid, i.e., a stable colloidal catalytic composition (dispersion), washing the substrate and then contacting the colloid adsorbed substrate with a composition comprising an activating agent (e.g., reducing agent) to form an activated state (e.g., reduced oxidation state) on the surface of the substrate, thus forming the catalytic nuclei active effective for the electroless build-up process upon subsequent immersion of the substrate in an appropriate electroless plating bath. Alternately, the second step may be deleted.

Activation may also encompass a selective dissolution of the colloidal stabilizer(s) when present on the substrate. Due to the stable nature of the colloidal dispersion, repetitive immersion in and usage of the catalytic composition is permitted.

For the sake of convenience, certain examples hereinafter will not refer to the intermediate rinsing step, but the need for such step should be recognized as good practice.

The following examples are illustrative of the present invention and are not to be taken in limitation thereof.

EXAMPLE 1

An ABS substrate was etched in a solution comprised of 400 g/l chromium oxide, 350 g/l concentrated sulfuric acid, and a fluorocarbon surfactant (FC-95) for several minutes at a temperature of 70° C. Thereafter, the etched substrate was immersed in the colloidal dispersions for three minutes.

A colloidal composition comprising the interaction product of the admixture of the following components was prepared.

| | |
|---|---|
| CuCl$_2$ | 0.8 g/l |
| Sn(BF$_4$)$_2$ | 0.36 g/l |
| NaBH$_4$ | 0.34 g/l |
| NaOH | 3.4 g/l |
| Daxad CP-1 | 2 ml/l |

In preparing this colloid, a nucleation temperature of about 70° C. was chosen and the reaction (nucleation of the colloid) was carried forth in a similar manner as in U.S. Pat. No. 3,958,048.

After the completion of the reaction and the colloid formation, CuCl and HCl were added to introduce an additional 0.1 g/l of CuCl and a final pH of 7. The extra Cu$^{+1}$ (cuprous) was not permitted to be reduced any further. The resulting colloidal composition with the added Cu(I) was found to adsorb (onto etched ABS) to a much greater density in comparison to the same colloidal composition (at the same pH) without the added Cu(I). Though the actual mechanism is not fully understood, the results are most surprising and useful Although I do not wish to be bound by theory, it is believed that the CU(I) is precipitated about the previously formed colloid (insoluble phase) due to the fact that Cu(I) is generally insoluble in the absence of special complexing agents. This colloidal admixture is of further significance since the ultimate incorporation of Cu(I) onto the surface can provide means for selective electroless plating. Specifically, Cu(I) can be irradiated with UV radiation thereby leading to the reaction:

$$2Cu^{+1} \xrightarrow{h\nu} Cu^{+2} + Cu^{\circ}$$

The Cu° will provide more active sites for the electroless plating initiation and particularly for electroless copper.

EXAMPLE 2

Similar to U.S. Pat. No. 3,958,048, a colloidal composition was prepared using the admixture of the following:

| | |
|---|---|
| CuCl | 4 g/l |
| Daxad CP-1 | 10 ml/l |
| NaBH$_4$ | 0.45 g/l |
| NaOH | 4.5 g/l |

Final pH was adjusted to 7.0. After pH adjustment, 0.5 g/l CuCl was further added insuring that the Cu+ is not further reduced. The resulting colloid was tested for plating using etched ABS substrates along with a commercial electroless copper bath (Shipley CP-74 at 50° C.). Plating results provided with 100% coverage.

It will further be obvious to one skilled in the pertinent art that many modifications and variations may be made in the preceding description without departing from the spirit and scope of the present invention. For example, it will be apparent that mixtures of reducing agents may be used in a single solution or may be used in successive steps. Furthermore, it is within the scope of the present invention to delete the use of a separate reducing solution and directly immerse the substrate (contacted previously with the colloidal catalytic composition) in an electroless plating formulation containing one or more reducing agents.

It should also be recognized by those skilled in the art that, from the present teachings, multiple combinations of materials shown in separate examples are possible and such combinations fall within the spirit of the invention. It is understood that the term copper colloid encompasses colloids whose nucleus is of either elemental copper, compounds of copper or alloys of copper and mixtures thereof.

I claim:

1. A process for the electroless plating of a non-conductor substrate comprising
contacting said substrate prior to plating with a colloidal composition comprising a copper colloid admixed with cuprous compound and wherein the admixing takes place subsequent to the production of the copper colloid.

2. The process according to claim 1 wherein said copper colloid is derived from a copper (II) compound.

3. The process according to claim 1 wherein said colloidal composition further contains a stabilizer.

4. The process according to claim 1 wherein said substrate is a printed circuitry type substrate.

5. The process according to claim 1 wherein said electroless plating is of copper.

* * * * *